United States Patent [19]

McKenney et al.

[11] Patent Number: 5,376,232
[45] Date of Patent: Dec. 27, 1994

[54] METHOD OF MANUFACTURING A PRINTED CIRCUIT BOARD

[75] Inventors: Darryl J. McKenney, Milford; Robert D. Cyr, Manchester, both of N.H.

[73] Assignee: Parlex Corporation, Methuen, Mass.

[21] Appl. No.: 110,540

[22] Filed: Aug. 23, 1993

[51] Int. Cl.⁵ .................... B44C 1/22; C23F 1/00; B05D 5/12
[52] U.S. Cl. .................... 156/656; 156/645; 156/902; 427/97
[58] Field of Search .............. 156/634, 656, 659.1, 156/901, 902, 645; 427/96, 98, 97; 29/846; 428/901, 209; 430/313, 314

[56] References Cited

U.S. PATENT DOCUMENTS

| | | | |
|---|---|---|---|
| 3,006,819 | 10/1961 | Wilson et al. | 156/902 X |
| 3,832,176 | 8/1974 | Verstraete et al. | 156/902 X |
| 3,936,575 | 2/1976 | Watanabe et al. | 428/417 |
| 3,962,520 | 6/1976 | Watanabe et al. | 428/414 |
| 4,215,387 | 7/1980 | Negishi | 361/398 |
| 4,311,749 | 1/1982 | Hiraiwa et al. | 428/209 |
| 4,338,149 | 7/1982 | Quascher | 156/248 |
| 4,556,628 | 12/1985 | Grescher et al. | 430/314 |
| 4,582,564 | 4/1986 | Shanfield et al. | 156/643 |
| 4,671,968 | 6/1987 | Slominski | 427/12 |
| 4,774,122 | 9/1988 | Adler | 428/156 |
| 4,781,969 | 11/1988 | Kobaysashi et al. | 428/209 |
| 4,783,247 | 11/1988 | Seibel | 204/181.1 |
| 4,800,461 | 1/1989 | Dixon et al. | 361/398 |
| 4,897,118 | 1/1990 | Ferrier | 106/1.11 |
| 4,897,165 | 1/1990 | Bernards et al. | 204/24 |
| 4,932,518 | 6/1990 | Bernards et al. | 204/52.1 |
| 4,958,050 | 9/1990 | Oku et al. | 174/261 |
| 4,964,945 | 10/1990 | Calhoun | 156/632 |
| 4,969,979 | 11/1990 | Appelt et al. | 204/15 |
| 5,004,525 | 4/1991 | Bernards et al. | 204/52.1 |
| 5,004,639 | 4/1991 | Desai | 428/138 |
| 5,068,013 | 11/1991 | Bernards et al. | 204/24 |
| 5,072,074 | 12/1991 | DeMaso et al. | 174/254 |
| 5,084,124 | 1/1992 | Taniguchi | 156/315 |
| 5,095,628 | 3/1992 | McKenney et al. | 29/846 |
| 5,097,390 | 3/1992 | Gerrie et al. | 361/412 |
| 5,100,492 | 3/1992 | Kober et al. | 156/250 |
| 5,112,694 | 5/1992 | Konotsune et al. | 428/457 |
| 5,121,297 | 6/1992 | Haas | 361/398 |
| 5,142,448 | 8/1992 | Kober et al. | 361/398 |
| 5,144,534 | 9/1992 | Kober | 361/398 |
| 5,144,742 | 9/1992 | Lucas et al. | 29/830 |
| 5,147,208 | 9/1992 | Bachler | 439/67 |
| 5,153,987 | 10/1992 | Takahashi et al. | 29/852 |
| 5,162,140 | 11/1992 | Taniguchi | 428/40 |
| 5,172,472 | 12/1992 | Linder et al. | 29/845 |
| 5,175,047 | 12/1992 | McKenney et al. | 428/209 |
| 5,178,318 | 1/1993 | Edwin et al. | 228/180.2 |
| 5,206,463 | 4/1993 | DeMaso et al. | 428/901 |
| 5,213,840 | 5/1993 | Retallick et al. | 427/97 |
| 5,214,571 | 5/1993 | Dahlgren et al. | 361/414 |

Primary Examiner—William Powell
Attorney, Agent, or Firm—Weingarten, Schurgin, Gagnebin & Hayes

[57] ABSTRACT

A method of depositing a conductive material on a surface of a printed circuit board, includes the steps of chemically treating at least a portion of a surface of the printed circuit board, disposing a resist layer over the chemically treated surface, depositing a conductive layer in the areas which are not covered by the resist, stripping the resist from the surface of the printed circuit board, and cleaning exposed chemically treated surfaces of the printed circuit board to remove contaminants from the surface of the printed circuit board which were introduced in the chemically treating step.

10 Claims, 3 Drawing Sheets

METHOD OF MANUFACTURING A PRINTED CIRCUIT BOARD

FIELD OF THE INVENTION

This invention relates to printed circuit boards and more particularly to conductor deposition on printed circuit boards.

BACKGROUND OF THE INVENTION

As is known in the art, printed circuit boards generally include conductive outer layers. Such outer layers are typically provided using a subtractive etching process. That is, the processing of the printed circuit board is begun with a full sheet of copper and selective portions of the copper are removed using a subtractive etching process. Any desired holes are then drilled on the printed circuit board. Electroless and electrolytic plating techniques may then be used to metalize the holes. In a subtractive etching process, it is relatively difficult to maintain the relatively small tolerances (i.e line width, etc. . . . ) required to manufacture printed circuit boards.

As is also known in the art, there has been a trend to reduce the size of electronic components and provide printed circuit boards having multi-chip modules etc. . . . This results in a need to increase the number of components such as surface mount components provided on a printed circuit board. This results in a so-called "densely populated" or simply "dense" printed circuit board. One problem with making such dense printed circuit boards is that the yield from the manufacture of such boards is relatively low. This low yield is due, in part, to the fact that such printed circuit boards are manufactured using a subtractive etching process in which it is relatively difficult to maintain predetermined tolerance ranges.

As is also known, in the conventional subtractive etching approach half-ounce copper is often disposed on the raw substrate and after lamination and subsequent drilling processes are performed, the substrate is then plated using one ounce of conductive plating. In those applications which require plated through holes, the plating is added and the metalized holes are provided having one ounce of copper therein while the plated surface of the substrate, is provided having one and one-half ounces of copper. This makes it more difficult to provide a solder connection in the plated through hole because the additional copper on the surface of the plated-through hole reduces the capillary action of the post soldering process.

Thus using the conventional approach, printed circuit boards have been manufactured using a drill and plate up technique. Such through-hole metalization techniques have become standard within the industry. One problem with such techniques, however, is that subtractive process must be performed on the external layer to provide external layer conductor definition.

SUMMARY OF THE INVENTION

In accordance with the present invention, a method of depositing a conductor on a printed circuit board includes the steps of chemically treating at least a portion of a surface of the printed circuit board, disposing a resist layer over the chemically treated surface, plating up conductive regions in the areas defined by the resist, stripping the resist from the surface of the printed circuit board, and cleaning the chemically treated surface of the printed circuit board to remove the chemicals disposed on the surface during the treating step. With this particular arrangement, a conductive layer is deposited on a surface of the printed circuit board using an additive deposition process. During the chemical treating process, a thin layer of palladium (Pd) having a thickness typically in the range of about 1Å–500Å is disposed on the surface of the printed circuit board. The Pd layer is contaminated with copper (Cu) particles such that the surface of the printed circuit on which the chemical treatment is performed becomes conductive. The resist layer may be disposed over the conductive surface of the printed circuit board using conventional techniques. The resist may be provided, for example, as dry-film which is a resist to plating. Next the plate up process may be used to provide any desired conductive regions such as conductive signal paths, etc. . . . Thus, if the dry-film is used for example, only those areas which are exposed (i.e. not covered by the dry-film resist) accept the plating. After, the plating step is accomplished the resist may be stripped from the substrate using conventional techniques. The cleaning step may include the step of micro-etching the contaminated surface of the printed circuit board to remove the remaining palladium from the surface of the printed circuit board. Thus, the chemically treated surface of the substrate is no longer conductive. With this particular technique, a printed circuit board may be manufactured having very fine features because an additive rather than a subtractive process is used to provide the conductors. By using an additive process the tolerances (e.g width, length, etc. . . . ) of the conductors may be more tightly controlled. Furthermore in those applications in which the printed circuit board has one or more so-called via or through-holes an even amount of plating may be disposed in the via holes. Furthermore, with the present invention an even amount of conductive material may be disposed both on the surface of the substrate and in the via hole. That is, the conductive material may be more evenly distributed on the printed circuit board including an even distribution of conductive material in the via hole. Thus, it is easier to solder to the plated through hole since the thermal heat sink effect caused by additional copper is reduced. Furthermore, since the conductors are disposed on the substrate using an additive process the printed circuit boards may be manufactured without the external processing operations required on the outer layers when a subtractive process is used. Moreover, by using an additive process, small tolerances may be maintained. Thus a concomitant increase in yield is provided in the manufacture of such printed circuit boards. This provides a concomitant reduction in the cost of manufacturing both rigid and rigid-flex printed circuit boards.

This process provides a printed circuit board having a desirable surface topography and eliminates the subtractive process. By eliminating the use of substractive processes, the amount of hazardous waste generated as a result of manufacturing printed circuit boards using substractive processes is reduced. Moreover, by using a so-called non-copper deposition process, it is possible to provide a substantially equal distribution of copper in the drilled hole and on the surface of the substrate. Furthermore, the process of the present invention eliminates multiple operations required to perform the subtractive etching steps of the outer layers in the conventional approach. This provides a concomitant reduction in the cost associated with providing printed circuit boards with plated through holes.

When manufacturing printed circuit boards during stackup or final lamination, the present invention allows the utilization of a high surface topography release sheet to allow for post bonding of a non electroless copper metalization process

BRIEF DESCRIPTION OF THE DRAWINGS

The foregoing features of this invention as well as the invention itself may be more fully understood from the following detailed description of the drawings in which.

DESCRIPTION OF THE PREFERRED EMBODIMENTS

Steps in the manufacture of a printed circuit board 22 (FIG. 1C) having a plurality of conductors 20 deposited using an additive process will now be described in conjunction with FIGS. 1-1D in which like elements are provided having like reference designations throughout the several views.

Figure 1:
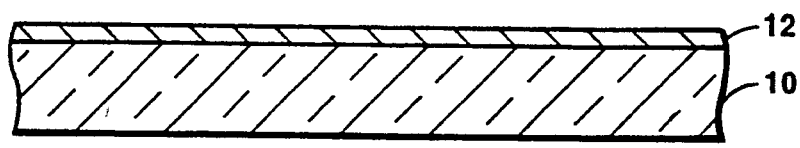
FIGS. 1-1D are a series of cross sectional views showing the additive process steps used to provide a conductor on a printed circuit board.

Referring now to FIG. 1 a substrate 10 comprised of a dielectric material is shown having a layer of palladium (Pd) 12 disposed over a first surface thereof. The PD layer 12 is provided having a thickness typically in the range of about 1Å-500Å. The Pd layer 12 may be provided from commercially available products such as that manufactured by AMP-AKZO Corporation, Newark, Del. and identified as part number PCK-502s ™ Cleaner/Conditioner for the EE-2000 ™ Process. Those of skill in the art should recognize however that other like commercially available products used in so-called copperless electroless deposition processes may also be used.

In the present invention, at least a portion of a surface of the substrate 10 is chemically treating to provide the Pd layer 12. The Pd layer 12 includes conductive particles, such as copper particles, of sufficient amount such that the surface of the substrate 10 becomes conductive.

Figure 1A:
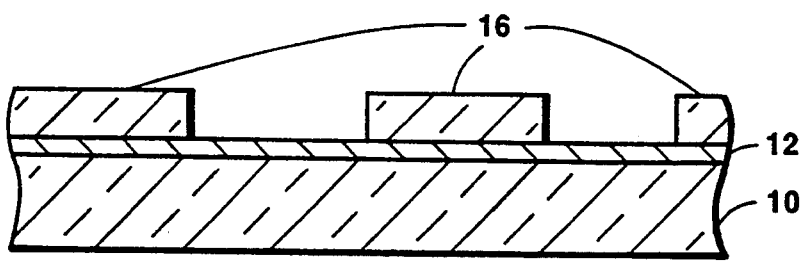

Referring now to FIG. 1A a photo-resist layer 16 is disposed over the Pd layer 12 using conventional resist deposition techniques. Here the resist layer 16 is provided as a so-called dry-film resist and thus only exposed areas 18a, 18b generally denoted 18 of the Pd layer 12 and substrate 10 will accept the plating material. Thus, the resist layer 16 is patterned such that plating will occur on the exposed regions 18 of the Pd layer 12 and substrate.

Figure 1B:
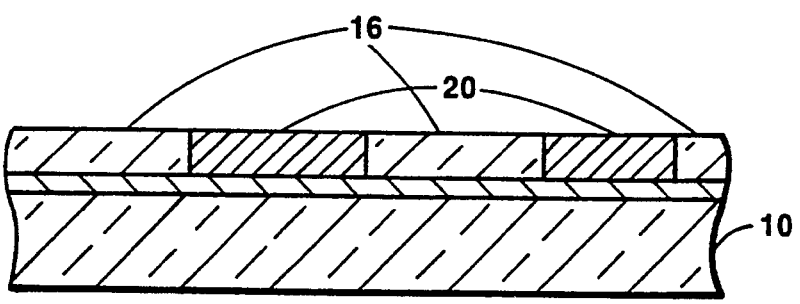

Referring now to FIG 1B, a conductive material such as copper for example is deposited through the photoresist layer 16 to provide conductive regions 20a, 20b generally denoted 20. The conductive regions 20 may correspond for example to a signal path of the printed circuit board.

Figure 1C:
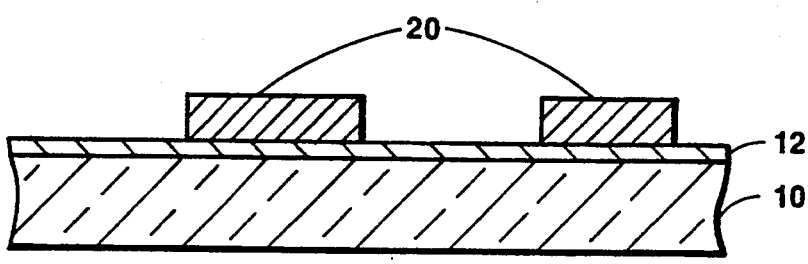
Figure 1D:
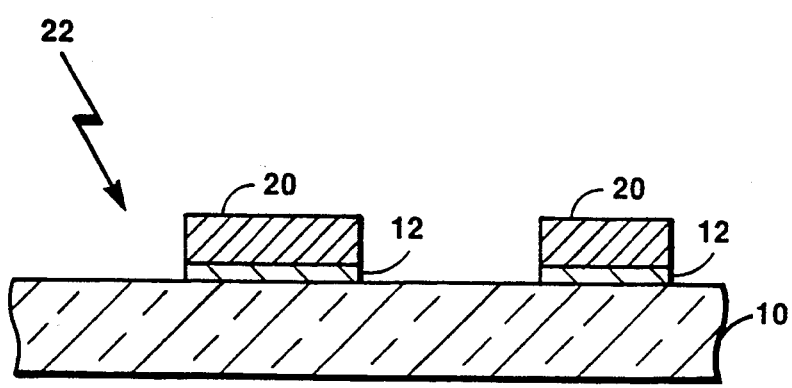

Referring now to FIG. 1C, after the plating step is complete, the resist layer 16 is stripped from the substrate 10 to leave behind conductors 20a, 20b. It should be noted that when the resist layer 16 is removed from the substrate 10, the Pd layer 12 remains on the surface of the substrate 10.

Referring now to FIG. 1C, a micro-etch of the surface of the substrate 10 in those regions around the conductors 20 is performed to remove the remaining Pd layer 12 from the surface of the substrate 10. Thus, the surface of the substrate 10 is no longer conductive except in the region below the conductors 20 and a printed circuit board 22 is provided.

With this particular technique the printed circuit board 22 may be manufactured having very fine features because an additive rather than a subtractive etching process is used to provide the conductors 20. By using an additive process, the tolerances may be more tightly controlled than in a subtractive process. Furthermore, with the present invention an even amount of conductive material may be disposed on the surface of the substrate 10. That is, the conductive material may be more evenly distributed on the printed circuit board 22.

Thus in the present invention, the conductors are disposed on the substrate using an additive process. By using an additive process, small tolerances may be maintained. Thus a concomitant increase in yield is provided in the manufacture of such printed circuit boards. This provides a concomitant reduction in the cost of manufacturing such printed circuit boards.

Figure 2:
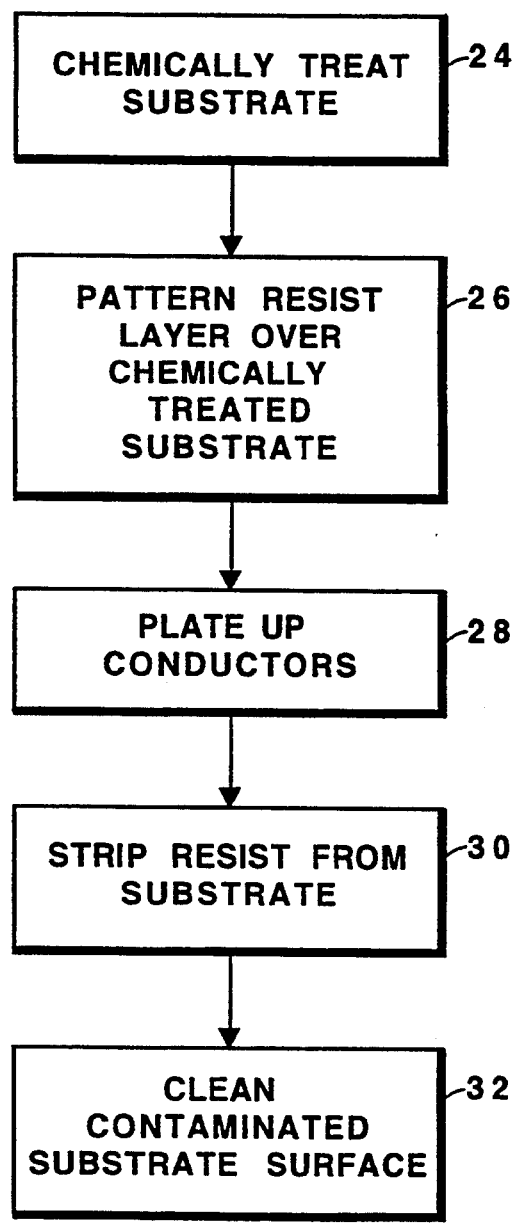
FIG. 2 is a flow diagram showing a the steps performed in the additive deposition process.

Referring now to FIG. 2 the general steps used in the additive conductor process are shown. First as shown in step 24 a surface of a substrate is chemically treated. Next as shown in step 26, a photo-resist layer is patterned over the substrate to define regions in which a plating material will be deposited.

The conductive regions are then provided using standard plating techniques to deposit the conductive layer through the photo-resist layer which exposes underlying portions of the substrate as shown in step 28. Then in step 30 the resist layer is stripped from the substrate to leave behind the conductive regions deposited in the plating step.

Finally, as shown in step 32, the substrate surface is cleaned of the chemical agent added in the treating step in those areas in which a conductor has not been deposited.

Figure 3:
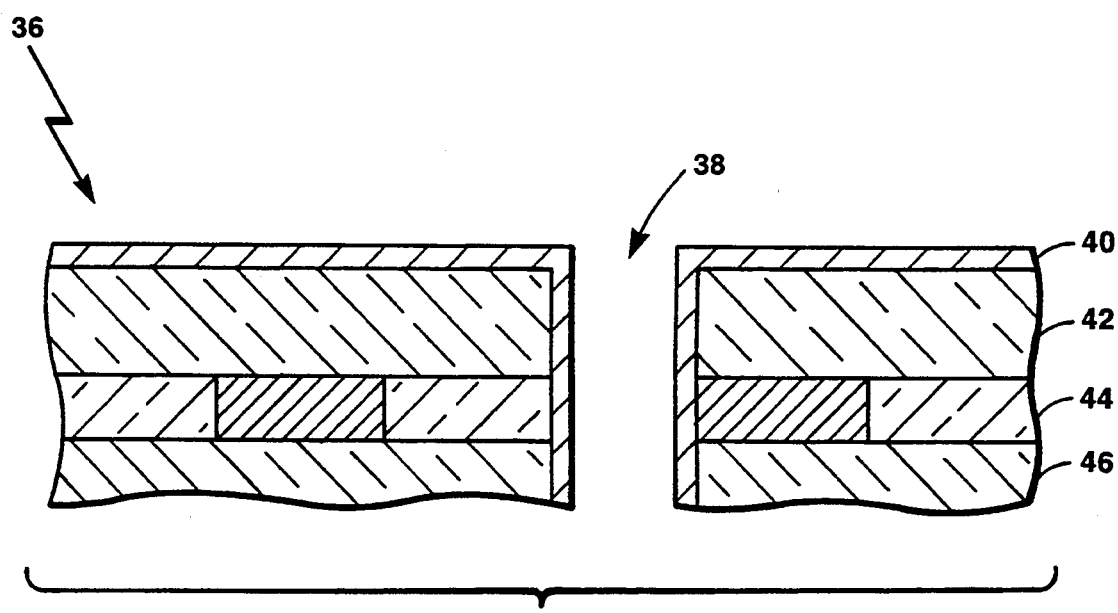
FIG. 3 is a cross sectional view of a printed circuit board having a plated surface and a plated through hole.

Referring now to FIG. 3, a printed circuit board 36 manufactured using the copperless electroless deposition technique described in conjunction with FIGS. 1-2 above is provided having a plated through via hole 38. By using the additive process, an even amount of plating may be disposed in such via holes 38. Thus, with the present invention an even amount of conductive material 40 may be disposed on the surface of the substrate 42 and in the via hole 38. By providing an even amount of plating in the via hole 38 and on the surface of the substrate 42, the soldering of the plated through holes 38 may be facilitated.

Having described preferred embodiments of the invention, it will now become apparent to one of skill in the art that other embodiments incorporating the concepts may be used. It is felt, therefore, that these embodiments should not be limited to disclosed embodiments but rather should be limited only by the spirit and scope of the appended claims.

What is claimed is:

1. A method of depositing a conductive material on a printed circuit board having a first surface and a second opposing surface, the method comprising the steps of:

(a) forming at least one hole in the printed circuit board wherein the hole has a first aperture in the first surface of the printed circuit board and a second aperture in the second surface of the printed circuit board;
(b) chemically treating at least a portion of the first surface of the printed circuit board which includes the hole;
(c) disposing a resist layer over at least a portion of the chemically treated surface;
(d) plating up conductive regions in the areas of the printed circuit board including the hole which are not covered by the resist in step (c);
(e) stripping the resist from the surface of the printed circuit board; and
(f) cleaning the chemically treated surface of the printed circuit board in the areas from which the resist is removed.

2. The method of claim 1 wherein step (b) includes the step of disposing a conductive layer having a thickness typically of about 1–500 angstroms on the first surface of the printed circuit board.

3. The method of claim 2 wherein step (d) includes the step of providing a dry-film which is a resist to plating, such that only those areas which are not covered by the resist are plated up.

4. The method of claim 3 wherein the cleaning step includes the step of micro-etching the first surface of the printed circuit board to remove the remaining conductive layer from the first surface of the printed circuit board such that the first surface of the printed circuit board is no longer conductive.

5. A method of depositing a conductive material on a surface of a printed circuit board, the method comprising the steps of:
(a) chemically treating at least a portion of a surface of the printed circuit board;
(b) disposing a resist layer over the chemically treated surface;
(c) plating up conductive regions in the areas which are not covered by the resist;
(d) stripping the resist from the surface of the printed circuit board;
(e) cleaning the chemically treated surface of the printed circuit board in the areas from which the resist is removed;
wherein step (a) includes the step of disposing a conductive layer having a thickness typically of about 1–500 angstroms on the surface of the printed circuit board;
wherein step (c) includes the step of providing a dry-film which is a resist to plating such that only those areas which are not covered by the resist are plated up;
wherein the cleaning step includes the step of micro-etching the surface of the printed circuit board to remove the remaining conductive layer from the printed circuit board such that the surface of the printed circuit board is no longer conductive; and
wherein the chemically treating step includes the step of depositing palladium and copper on the surface of the printed circuit board.

6. The method of claim 5 wherein the amount of copper deposited in conjunction with the palladium is sufficient to make the surface of the printed circuit board conductive.

7. The method of claim 6 wherein the cleaning step includes the step of micro-etching the surface of the printed circuit board such that the surface of the printed circuit board is no longer conductive.

8. A method of depositing a conductive material on a surface of a printed circuit board, the method comprising the steps of:
(a) chemically treating at least a portion of a surface of the printed circuit board;
(b) disposing a resist layer over the chemically treated surface;
(c) plating up conductive regions in the areas which are not covered by the resist;
(d) stripping the resist from the surface of the printed circuit board;
(e) cleaning the chemically treated surface of the printed circuit board in the areas from which the resist is removed;
wherein step (a) includes the step of disposing a conductive layer having a thickness typically of about 1–500 angstroms on the surface of the printed circuit board; and
wherein the conductive layer is provided as a layer of palladium having copper particles as part thereof.

9. The method of claim 8 wherein step (c) includes the step of providing a dry-film which is a resist to plating such that only those areas which are exposed through the resist are plated up.

10. The method of claim 9 wherein the cleaning step includes the step of micro-etching of the surface of the printed circuit board to remove the remaining palladium from the surface of the printed circuit board such that the surface of the printed circuit board is no longer conductive.

* * * * *